US011495299B2

(12) United States Patent
Cowles et al.

(10) Patent No.: US 11,495,299 B2
(45) Date of Patent: Nov. 8, 2022

(54) NON-VOLATILE MEMORY DEVICES AND SYSTEMS WITH VOLATILE MEMORY FEATURES AND METHODS FOR OPERATING THE SAME

(71) Applicant: Micron Technology, Inc., Boise, ID (US)

(72) Inventors: Timothy B. Cowles, Boise, ID (US); George B. Raad, Boise, ID (US); James S. Rehmeyer, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/339,846

(22) Filed: Jun. 4, 2021

(65) Prior Publication Data
US 2021/0295880 A1 Sep. 23, 2021

Related U.S. Application Data

(62) Division of application No. 15/959,868, filed on Apr. 23, 2018, now Pat. No. 11,049,565.

(51) Int. Cl.
*G11C 16/14* (2006.01)
*G11C 16/30* (2006.01)
(Continued)

(52) U.S. Cl.
CPC ......... *G11C 16/14* (2013.01); *G11C 11/165* (2013.01); *G11C 11/1653* (2013.01);
(Continued)

(58) Field of Classification Search
CPC ..................................................... G11C 16/14
(Continued)

(56) References Cited

U.S. PATENT DOCUMENTS 7,152,095 B1 * 12/2006 Motoyama ............ G06F 21/554
709/212
8,120,949 B2 2/2012 Ranjan et al.
(Continued)

FOREIGN PATENT DOCUMENTS

| JP | 2004342170 A | 12/2004 |
| JP | 2005292959 A | 10/2005 |
| JP | 2016091059 A | 5/2016 |

OTHER PUBLICATIONS

International Application No. PCT/US2019/023377—International Search Report and Written Opinion, dated Jul. 4, 2019, 10 pages.
(Continued)

*Primary Examiner* — Muna A Techane
(74) *Attorney, Agent, or Firm* — Perkins Coie LLP

(57) ABSTRACT

Memory devices, systems including memory devices, and methods of operating memory devices and systems are provided, in which at least a subset of a non-volatile memory array is configured to behave as a volatile memory by erasing or degrading data in the event of a changed power condition such as a power-loss event, a power-off event, or a power-on event. In one embodiment of the present technology, a memory device is provided, comprising a non-volatile memory array, and circuitry configured to store one or more addresses of the non-volatile memory array, to detect a changed power condition of the memory device, and to erase or degrade data at the one or more addresses in response to detecting the changed power condition.

19 Claims, 3 Drawing Sheets

---

SEND A MEMORY DEVICE A FIRST COMMAND TO CONFIGURE A SUBSET OF A NON-VOLATILE MEMORY ARRAY TO ERASE OR DEGRADE DATA STORED THEREIN IN RESPONSE TO A CHANGED POWER CONDITION OF THE MEMORY DEVICE — 310

STORE DATA CONFIGURED TO BE ERASED OR DEGRADED IN RESPONSE TO A CHANGED POWER CONDITION OF THE MEMORY DEVICE IN THE SUBSET OF THE NON-VOLATILE MEMORY ARRAY — 320

(51) Int. Cl.
    *G11C 17/16*     (2006.01)
    *G11C 17/18*     (2006.01)
    *G11C 16/22*     (2006.01)
    *G11C 13/00*     (2006.01)
    *G11C 11/16*     (2006.01)
    *G11C 11/22*     (2006.01)
    *G11C 16/08*     (2006.01)

(52) U.S. Cl.
    CPC ...... *G11C 11/1675* (2013.01); *G11C 11/1697* (2013.01); *G11C 11/225* (2013.01); *G11C 11/2253* (2013.01); *G11C 11/2275* (2013.01); *G11C 11/2297* (2013.01); *G11C 13/0004* (2013.01); *G11C 13/0023* (2013.01); *G11C 13/0038* (2013.01); *G11C 13/0059* (2013.01); *G11C 13/0097* (2013.01); *G11C 16/08* (2013.01); *G11C 16/22* (2013.01); *G11C 16/30* (2013.01); *G11C 17/165* (2013.01); *G11C 17/18* (2013.01)

(58) Field of Classification Search
    USPC .................................................... 365/185.33
    See application file for complete search history.

(56) References Cited

U.S. PATENT DOCUMENTS

| | | |
|---|---|---|
| 10,446,248 B1 | 10/2019 | Cowles et al. |
| 2002/0184458 A1 | 12/2002 | Kaneko et al. |
| 2006/0080494 A1* | 4/2006 | Kawaguchi ......... G06F 11/2015 711/4 |
| 2006/0117393 A1 | 6/2006 | Merry et al. |
| 2008/0209117 A1 | 8/2008 | Kajigaya |
| 2009/0113136 A1 | 4/2009 | Aharonov |
| 2009/0259808 A1* | 10/2009 | Koren .................. G11C 16/102 711/103 |
| 2012/0093318 A1 | 4/2012 | Obukhov et al. |
| 2012/0110238 A1 | 5/2012 | Blawat |
| 2012/0278579 A1* | 11/2012 | Goss .................. G06F 12/0246 711/166 |
| 2016/0034217 A1 | 2/2016 | Kim et al. |
| 2016/0188495 A1 | 6/2016 | Naeimi et al. |
| 2017/0063546 A1 | 3/2017 | Zhang et al. |
| 2017/0262180 A1* | 9/2017 | Earhart ................ G06F 3/0604 |
| 2019/0325966 A1* | 10/2019 | Cowles ............... G11C 11/2297 |
| 2019/0325974 A1 | 10/2019 | Cowles et al. |
| 2019/0371420 A1 | 12/2019 | Cowles et al. |
| 2021/0098068 A1 | 4/2021 | Cowles et al. |

OTHER PUBLICATIONS

KR Patent Application No. 10-2020-7033090—Korean Office Action and Search Report, dated Oct. 30, 2021, with English Translation, 13 pages.

European Patent Application No. 19793241.1—Extended European Search Report dated Nov. 23, 2021, 9 pages.

Japanese Patent Application No. 2020-558926—Notice of Rejection with English Translation dated Jan. 5, 2022, 12 pages.

\* cited by examiner

NON-VOLATILE MEMORY DEVICES AND SYSTEMS WITH VOLATILE MEMORY FEATURES AND METHODS FOR OPERATING THE SAME

CROSS-REFERENCE TO RELATED APPLICATIONS

This application is a division of U.S. patent application Ser. No. 15/959,868, filed Apr. 23, 2018; which is incorporated herein by reference in its entirety.

This application contains subject matter related to an U.S. Patent Application by Timothy B. Cowles, Jonathan S. Parry, George B. Raad, and James S. Rehmeyer titled "NON-VOLATILE MEMORY DEVICES AND SYSTEMS WITH READ-ONLY MEMORY FEATURES AND METHODS FOR OPERATING THE SAME". The related application is assigned to Micron Technology, Inc., and is identified as U.S. patent application Ser. No. 15/959,921, filed on Apr. 23, 2018. The subject matter thereof is incorporated herein by reference thereto.

TECHNICAL FIELD

The present disclosure generally relates to semiconductor memory devices, and more particularly relates to non-volatile memory devices and systems with volatile memory features and methods for operating the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Non-volatile memory devices are frequently used for the storage of data, due to the persistence thereof in the absence of applied power. With recent advances in non-volatile memory technologies improving the speed and cost of non-volatile memory, non-volatile memory devices are increasingly being used in applications other than storage. For example, as non-volatile memory devices improve to the point that they can provide similar speed and/or endurance as volatile memory devices, they may increasingly be used in place of volatile memory devices to provide caches, primary memories, or to fill other traditional volatile memory applications.

Although the persistent storage of data even in the absence of applied power is usually considered a benefit of non-volatile memory technologies, the use of non-volatile memory devices in applications previously performed by volatile memory devices may raise new concerns. For example, due to the volatile nature of the memory providing many caches or primary memories in which sensitive information such as passwords, financial information, medical information or the like may be temporarily stored (e.g., potentially in clear-text or unencrypted format), powering down a system in which a volatile memory devices stores this sensitive data could be relied upon as a defense against physically accessing the data. With non-volatile memory devices taking the place of volatile memory devices in these roles, however, physical access to a system could permit an avenue for unauthorized access to the data, e.g., by interrupting power to the system and removing the non-volatile memory devices on which the sensitive data could still be stored.

Accordingly, several embodiments of the present technology are directed to memory devices, systems including memory devices, and methods of operating memory devices and systems in which at least a subset of a non-volatile memory array is configured to behave as a volatile memory by erasing or degrading data in the event of a power loss. In one embodiment of the present technology, a memory device is provided, comprising a non-volatile memory array, and circuitry configured to store one or more addresses of the non-volatile memory array, to detect a changed power condition of the memory device, and to erase or degrade data at the one or more addresses in response to detecting the changed power condition.

Figure 1:
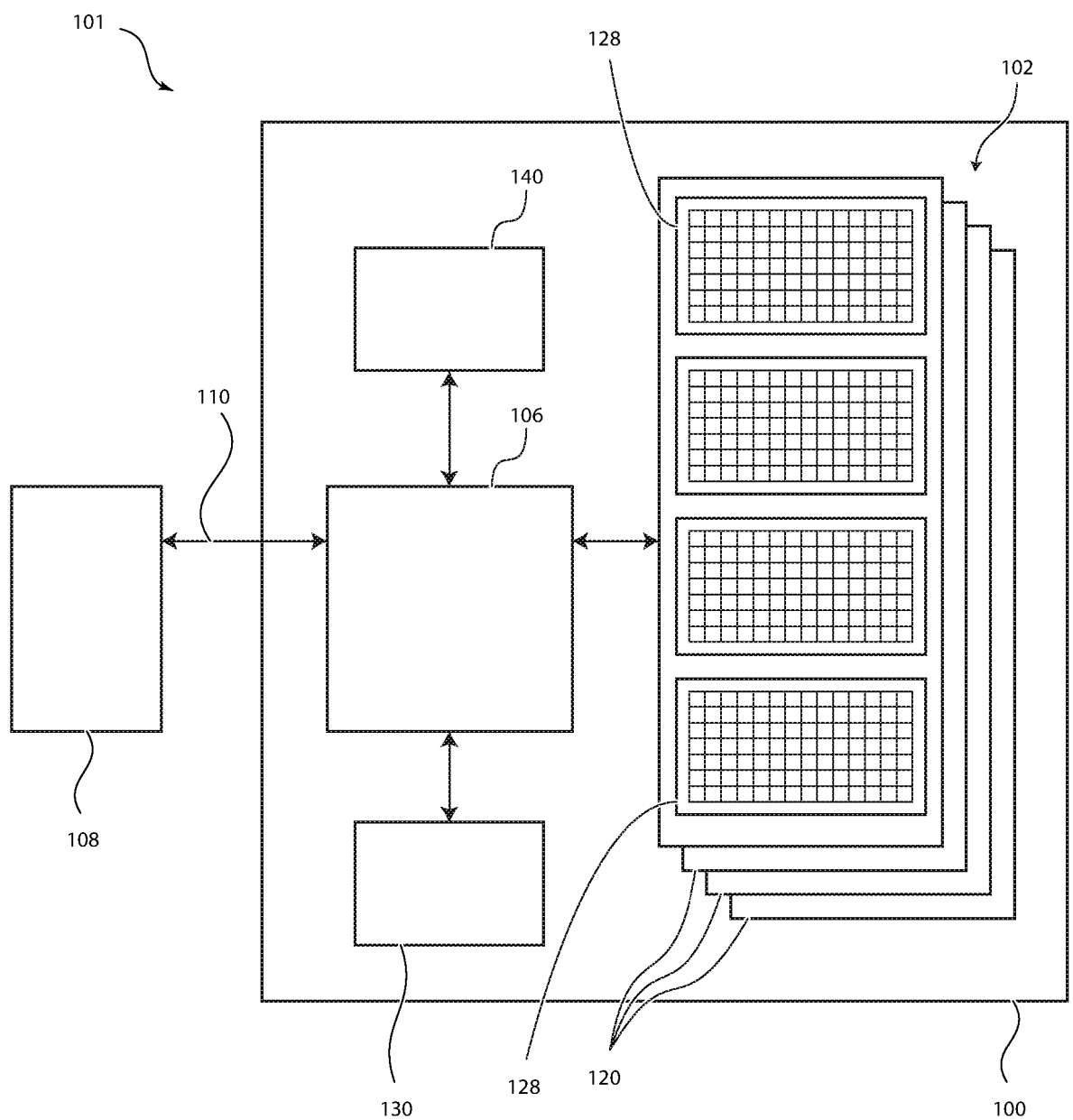
FIG. 1 is a block diagram schematically illustrating a memory device in accordance with an embodiment of the present technology.

FIG. 1 is a block diagram of a system 101 having a memory device 100 configured in accordance with an embodiment of the present technology. As shown, the memory device 100 includes a main memory 102 (e.g., DRAM, NAND flash, NOR flash, FeRAM, PCM, etc.) and control circuitry 106 operably coupled to a host device 108 (e.g., an upstream central processor (CPU)). The main memory 102 includes a plurality of memory regions, or memory units 120, which each include a plurality of memory cells. The memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory units 120 may, in some embodiments, also be sub-divided into memory regions 128 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells and other functionality, such as for processing information and/or communicating with the control circuitry 106 or the host device 108. The memory cells can be arranged in rows (e.g., each corresponding to a word line) and columns (e.g., each corresponding to a bit line). In other embodiments, the memory cells can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, regions, and memory units can vary, and can, in other embodiments, be larger or smaller in scale than shown in the illustrated examples. For example, in some embodiments, the memory device 100 can include only one memory unit 120. Alternatively, the memory device 100 can include two, three, four, eight, ten, or more (e.g., 16, 32, 64, or more) memory units 120. Although the memory units 120 are shown in FIG. 1 as including two memory regions 128 each, in other embodiments, each memory unit 120 can include one, three, four eight, or more (e.g., 16, 32, 64, 100, 128, 256 or more) memory regions.

In one embodiment, the control circuitry 106 can be provided on the same die as the main memory 102 (e.g., including command/address/clock input circuitry, decoders, voltage and timing generators, input/output circuitry, etc.). In another embodiment, the control circuitry 106 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 106 can include a processor configured to execute instructions stored in memory to perform various processes, logic flows, and routines for controlling operation of the memory device 100, including managing the main memory 102 and handling communications between the memory device 100 and the host device 108. In some embodiments, the control circuitry 106 can include embedded memory for storing, e.g., memory pointers, fetched data, etc. In another embodiment of the present technology, a memory device may not include control circuitry, and may instead rely upon external control (e.g., provided by the host device 108, or by a processor or controller separate from the memory device).

In operation, the control circuitry 106 can directly write or otherwise program (e.g., erase) the various memory regions of the main memory 102. The control circuitry 106 communicates with the host device 108 over a host-device bus or interface 110. In some embodiments, the host device 108 and the control circuitry 106 can communicate over a dedicated memory bus (e.g., a DRAM bus). In other embodiments, the host device 108 and the control circuitry 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the control circuitry 106. A request can include a command to read, write, erase, return information, and/or to perform a particular operation (e.g., a TRIM operation, a precharge operation, an activate operation, a wear-leveling operation, a garbage collection operation, etc.).

The host device 108 can be any one of a number of electronic devices capable of utilizing memory for the temporary or persistent storage of information, or a component thereof. For example, the host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to memory device 100, although in other embodiments, the host device 108 may be indirectly connected to memory device (e.g., over a networked connection or through intermediary devices).

In some embodiments, the control circuitry 106 can configure a subset of the main memory 102 to behave as a volatile memory, in which the data can be erased or degraded in the event of a power loss. In some embodiments, degrading data may be considered equivalent to erasing that data to any practical effect. For example, it would not be possible to obtain sensitive data from either degraded data nor erased data. In this regard, the control circuitry 106 can be configured to store (e.g., in the main memory 102, in an embedded memory of the control circuitry 106, in a separate dedicated memory, etc.) one or more addresses (e.g., corresponding to cells, rows, columns, pages, etc.) of the main memory 102. The controller can store the one or more addresses in response to a command received at the memory device 100 (e.g., from the host device 108). Alternatively, the one or more addresses can be stored at the time of manufacture or initial setup of the memory device 100. The control circuitry can be further configured to detect a power-off event (e.g., the intentional shutdown of the memory device 100) or a power-loss event (e.g., the absence of externally applied power, a reduction in the voltage or current thereof, any deviation in the applied power from an acceptable range, etc.) and, in response, to erase or degrade (e.g., by overwriting with a predetermined pattern or a pseudorandom pattern) the data in the subset of the main memory 102 corresponding to the one or more stored addresses.

In accordance with an aspect of the present technology, the memory device 100 can include a backup energy storage mechanism 140, such as one or more capacitors, batteries, fuel cells or the like, capable of supplying sufficient power for a sufficient duration for the control circuitry 106 to perform the erasing and/or degrading operation upon detecting a power-loss event. The backup energy storage mechanism 140 can be configured to store energy when an externally applied power is available, and to provide the energy to the control circuitry 106 and/or the other components of the memory device 100 when the externally applied power is no longer available (or otherwise unsuitable). The backup energy storage mechanism 140 can be configured to have an energy storage capacity based upon the size of the subset of main memory 102 that is configured to behave as a volatile memory (e.g., the energy storage capacity may be larger when the subset of main memory 102 to be erased and/or degraded upon power loss is larger). In this regard, providing a larger energy storage capacity (e.g., greater capacitance, larger batteries, etc.) can enable a larger subset of the main memory 102 to be configured to behave as a volatile memory.

For added security, in some embodiments of the present technology, the one or more addresses of the non-volatile main memory 102 to be erased or degraded upon detecting a changed power condition can be stored in a write-once, read-many (WORM) memory 130, such as an array of fuses or anti-fuses. By writing the one or more addresses to a memory location which is subsequently unmodifiable, the security provided by erasing or degrading the data at the one or more addresses in response to a changed power condition can be better assured (e.g., a malicious actor will be unable to alter the pseudo-volatile behavior of the one or more addresses by overwriting, removing or otherwise modifying the stored addresses in the WORM memory 130).

In accordance with another aspect of the present technology, the control circuitry 106 can be configured to perform the erasing and/or degrading of the stored one or more addresses at a power-on event of the memory device 100. In this regard, the security of the data stored at the one or more addresses of the main memory 102 configured to behave as a volatile memory can be improved by erasing or degrading data at those addresses on a power-up event (e.g., if the data was not fully erased or degraded at a previous power-off or power-loss event, erasing and/or degrading the data at a power-on event when can compensate by fully erasing or degrading all the data at the one or more addresses). Moreover, erasing and/or degrading the data at a power-on event in lieu of doing so at a power-loss or power-off event can permit the foregoing approach to be implemented in memory devices with little or no energy storage capability (e.g., in which the backup energy storage mechanism 140 is absent). Accordingly, in some embodiments, the control circuitry 106 can be configured to detect a power-on event, and in response, to erase and/or degrade data at the one or more addresses corresponding to the subset of the main memory 102 configured to behave as a volatile memory.

Figure 2:
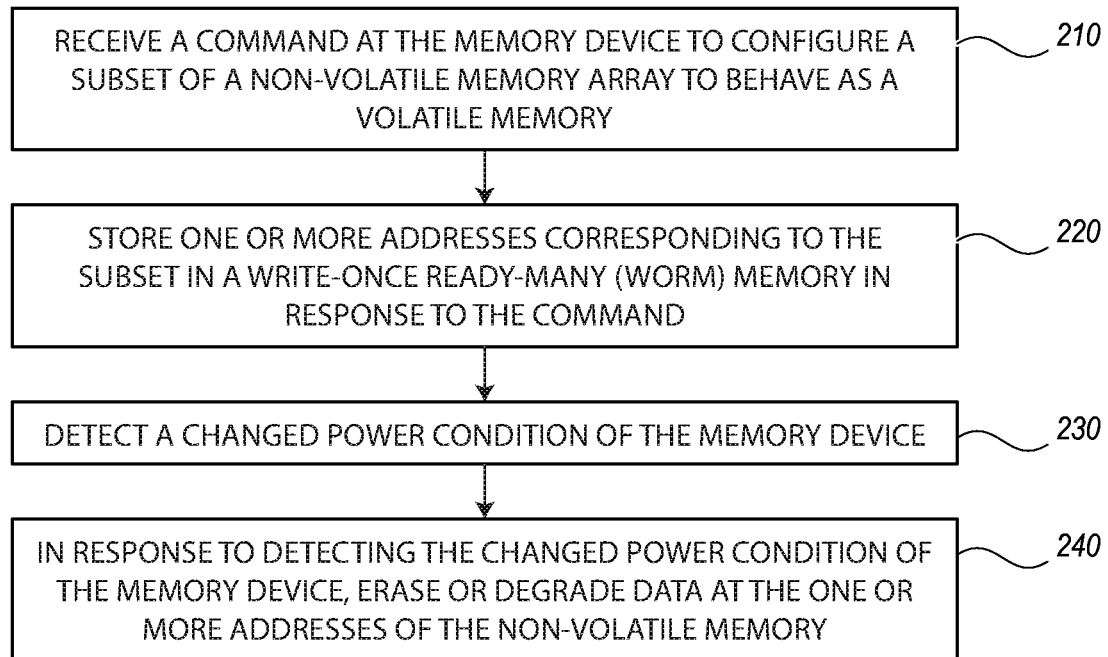
FIG. 2 is a flow chart illustrating a method of operating a memory device in accordance with an embodiment of the present technology.

FIG. 2 is a flow chart illustrating a method of operating a memory device in accordance with an embodiment of the present technology. The method includes receiving a command at the memory device to configure a subset of a non-volatile memory array to behave as a volatile memory (box 210) and storing one or more addresses corresponding to the subset in response to the command (box 220). In accordance with one aspect of the present technology, the one or more addresses can be stored in a write-once, read-many (WORM) memory of the memory device. In accordance with another aspect, however, the one or more addresses can be stored in a main memory of the memory device, an embedded memory of a controller thereof, or in a dedicated memory that is rewritable. The method further includes detecting a changed power condition of the memory device (box 230) and erasing or degrading data at the one or more addresses in response to the detection (box 240). In some embodiments, degrading data may be considered equivalent to erasing that data to any practical effect. For example, it would not be possible to obtain sensitive data from either degraded data nor erased data. In accordance with one aspect of the present technology, the changed power condition can be a power-off event, a power-loss event, a power-on event, or the like.

Figure 3:
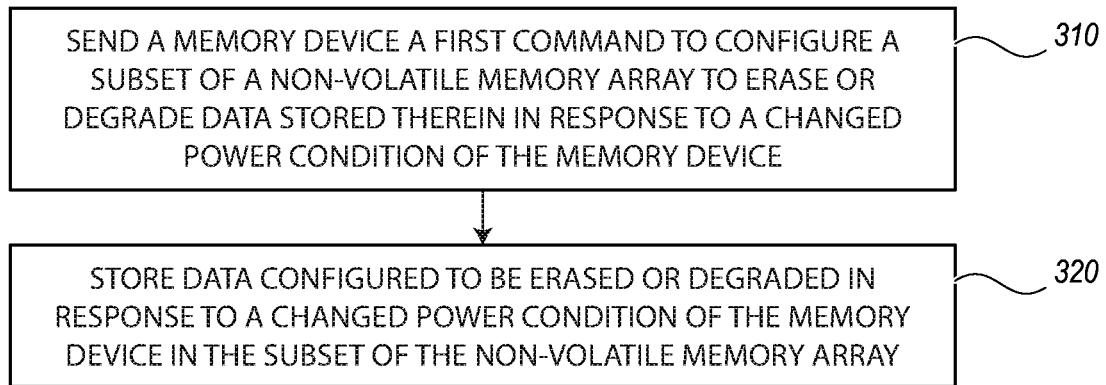
FIG. 3 is a flow chart illustrating a method of operating a memory device in accordance with an embodiment of the present technology.

FIG. 3 is a flow chart illustrating a method of operating a memory device in accordance with an embodiment of the present technology. The method includes sending a command to the memory device to configure a subset of a non-volatile memory array to behave as a volatile memory (e.g., to erase and/or degrade data stored therein in response to a changed power condition of the memory device) (box 310). The method further includes storing data configured to be erased or degraded at the one or more addresses corresponding to the subset (box 320). In accordance with one aspect of the present technology, the changed power condition can be a power-off event, a power-loss event, a power-on event, or the like. For example, it would not be possible to obtain sensitive data from either degraded data nor erased data.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of operating a memory device including a non-volatile memory array, comprising:
    sending a command to the memory device to configure a subset of the non-volatile memory array to erase or degrade data stored therein in response to a changed power condition of the memory device; and
    storing data in the subset of the non-volatile memory array configured to be erased or degraded in response to the changed power condition of the memory device.

2. The method of claim 1, wherein the subset comprises one or more addresses, and wherein the command instructs the memory device to store the one or more addresses in a write-once read-many (WORM) memory of the memory device.

3. The method of claim 2, wherein the write-once read-many (WORM) memory comprises an array of fuses, anti-fuses, or a combination thereof.

4. The method of claim 1, wherein the subset comprises one or more addresses, and wherein the command instructs the memory device to store the one or more addresses in a register of the memory device.

5. The method of claim 1, wherein the non-volatile memory array comprises NAND flash, NOR flash, MRAM, FeRAM, PCM, or a combination thereof.

6. The method of claim 1, further comprising effecting the changed power condition to trigger erasure or degradation of the stored data.

7. The method of claim 1, wherein the data is first data and the subset is a first subset, further comprising storing second data in a second subset of the non-volatile memory array configured to retain the data through the changed power condition of the memory device.

8. The method of claim 1, wherein the subset comprises a first address range, and wherein the command instructs the memory to store a second address range exclusive of the first address range.

9. The method of claim 1, wherein the subset is configured to erase or degrade the data in response to the changed power condition of the memory device by overwriting the data with a pseudorandom pattern.

10. The method of claim 1, wherein sending the command is performed by an end user of the memory device.

11. The method of claim 1, wherein sending the command is performed during the manufacture of the memory device.

12. The memory system of claim 1, wherein the data is configured to be erased or degraded subset is configured to erase or degrade the data in response to the changed power condition of the memory device by overwriting the data with a pseudorandom pattern.

13. A memory system, comprising:
    a memory device including a non-volatile memory array; and
    a memory controller configured to:
        send a command to the memory device to configure a subset of the non-volatile memory array to erase or degrade data stored therein in response to a changed power condition of the memory device, and
        store data in the subset of the non-volatile memory configured to be erased or degraded in response to the changed power condition of the memory device.

14. The memory system of claim 13, wherein the subset comprises one or more addresses, and wherein the command instructs the memory device to store the one or more addresses in a write-once read-many (WORM) memory of the memory device.

15. The memory system of claim 14, wherein the write-once read-many (WORM) memory comprises an array of fuses, anti-fuses, or a combination thereof.

16. The memory system of claim 13, wherein the subset comprises one or more addresses, and wherein the command instructs the memory device to store the one or more addresses in a register of the memory device.

17. The memory system of claim 13, wherein the non-volatile memory array comprises NAND flash, NOR flash, MRAM, FeRAM, PCM, or a combination thereof.

18. The memory system of claim 13, wherein the data is first data and the subset is a first subset, and wherein the memory controller is further configured to store second data in a second subset of the non-volatile memory array configured to retain the data through the changed power condition of the memory device.

19. The memory system of claim 13, wherein the subset comprises a first address range, and wherein the command instructs the memory to store a second address range exclusive of the first address range.

* * * * *